(12) United States Patent
Kuhne

(10) Patent No.: US 6,476,657 B2
(45) Date of Patent: Nov. 5, 2002

(54) PULSE GENERATOR FOR GENERATING AN OUTPUT IN RESPONSE TO A DELAY TIME

(75) Inventor: Sebastian Kuhne, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/758,998

(22) Filed: Jan. 11, 2001

(65) Prior Publication Data

US 2001/0019282 A1 Sep. 6, 2001

(30) Foreign Application Priority Data

Jan. 11, 2000 (DE) .......................................... 100 00 758

(51) Int. Cl.[7] ................................................. G06F 1/04
(52) U.S. Cl. ....................................... 327/291; 327/217
(58) Field of Search ................................. 327/217, 218, 327/291, 293, 294, 299; 326/93, 95; 365/230.3, 195; 331/48, 158

(56) References Cited

U.S. PATENT DOCUMENTS

| | | | | |
|---|---|---|---|---|
| 4,224,639 A | * | 9/1980 | Belisomi | 358/158 |
| 5,059,818 A | * | 10/1991 | Witt et al. | 327/175 |
| 5,404,335 A | * | 4/1995 | Tobita | 365/193 |
| 5,761,151 A | * | 6/1998 | Hatakeyama | 265/233.5 |
| 6,016,081 A | * | 1/2000 | O'Shaughnessy | 331/48 |
| 6,061,285 A | * | 5/2000 | Tsukikawa | 365/201 |
| 6,115,282 A | * | 9/2000 | Abe et al. | 365/195 |
| 6,178,133 B1 | * | 1/2001 | Manning | 265/230.03 |

FOREIGN PATENT DOCUMENTS

| | | |
|---|---|---|
| DE | 2137068 | 2/1973 |
| DE | 2807409 | 8/1979 |

OTHER PUBLICATIONS

Japanese Patent Abstract No. 0059161912 AA (Yoshihiro et al.), dated Sep. 12, 1984.

* cited by examiner

Primary Examiner—Timothy P. Callahan
Assistant Examiner—Linh Nguyen
(74) Attorney, Agent, or Firm—Laurence A. Greenberg; Werner H. Stemer; Ralph E. Locher

(57) ABSTRACT

A pulse generator circuit, in particular for use in or for integrated circuits, which, in the usual way, has a number of inverting elements connected in series, a logic combining element and a delay element. A buffer circuit provided in accordance with the invention ensures that a minimum pulse length of the output pulse generated in response to the input signal is ensured even in the case of an input signal of a very short duration.

14 Claims, 3 Drawing Sheets

PULSE GENERATOR FOR GENERATING AN OUTPUT IN RESPONSE TO A DELAY TIME

BACKGROUND OF THE INVENTION

Field of the Invention

The invention relates to a pulse generator for integrated circuits.

In order to drive integrated circuits, for example dynamic random access memories (DRAMs), with pulses, input pulses are needed which have a defined minimum pulse length. Here, the problem often occurs that the pulse length of an output pulse derived from a very short input signal by using conventional pulse generator circuits cannot be produced with the desired reliability and stability.

Using a conventional pulse generator circuit, an output pulse with a guaranteed maximum pulse length can be generated from an input signal represented by a leading edge. The pulse generator circuit contains a NAND element which has two inputs, one input being supplied with the input signal undelayed and the other input being supplied with an input signal delayed by a delay element. The output from the NAND element goes low when the state of both input signals through the NAND element is high, that is to say only when the change in potential from low to high, representing the input signal, has also reached the second input of the NAND element after being delayed by the delay element. Following inversion by an inverter element, a pulse-like output signal is output at the output terminal, the length of the pulse being determined by the delay time of the delay element. However, the generation of the output pulse is impossible or undefined when an input signal decays again in a shorter time than the delay time of the delay element, since at the time at which the second input to the NAND element goes high, the potential at the first input to the NAND element has already gone low again.

German Patent DE 21 37 068 B2 includes a description of a circuit configuration for suppressing interfering pulses, in which one input leads via a direct connection to a reset input of a bistable flip-flop circuit or to a time-determining stage. The bistable flip-flop stage is constructed from first NAND elements. The time-determining stage contains a high-pass filter with a downstream inverting, potential-controlled flip-flop circuit, which is formed by a second NAND element. This circuit configuration is overall preceded by a further NAND element, in order to process inverted input pulses. The first NAND elements are cross-coupled, and an output signal contains only that part of a useful pulse from an input signal that exceeds a maximum suppression time. Moreover, Published, Japanese Patent Application JP 0059161912 A discloses a pulse generator circuit in which an input signal is fed to a delay element and an output signal is selected by a selection circuit in an operating mode. The inverted signal from the input signal is then supplied to an AND element, which outputs a clock pulse. A further signal, which is sent through an additional delay element in a test mode, is selected by the selection circuit. A broad clock pulse is therefore obtained, and the signal transmission time between locking elements is checked.

Finally, Published, Non-Prosecuted German Patent Application DE 28 07 409 A1 discloses a circuit configuration for coupling out pulses in which the NOR elements are used for buffering.

SUMMARY OF THE INVENTION

It is accordingly an object of the invention to provide a pulse generator that overcomes the above-mentioned disadvantages of the prior art devices of this general type, which, in particular, is suitable for application in integrated circuits and which can generate an output pulse with a defined minimum pulse length even in the case of input signals which last for a very short time.

With the foregoing and other objects in view there is provided, in accordance with the invention, a pulse generator.

The pulse generator contains a NOR gate having a first input, a second input, and an output. An inverter is provided and has an input connected to the output of the NOR gate and an output. An output terminal is connected to the output of the inverter. An input terminal for receiving an input signal is connected directly, via a first signal path, to the first input of the NOR gate. A delay element having an input connected to the input terminal and an output is provided. The delay circuit receives the input signal and delays propagation of the input signal by a delay time. A buffer circuit having a first input connected, via a second signal path, to the input terminal, a second input connected to the output of the delay element, and an output connected to the second input of the NOR gate, is provided. The buffer circuit receives and is set by the input signal virtually without delay. The buffer circuit is reset after an expiry of the delay time defined by the delay element and leads to a generation of an output pulse with a defined minimum pulse length available at the output terminal if the input signal is less than the delay time, and if the input signal is longer than the delay time, a pulse length of the output pulse is defined by a pulse length of the input signal.

The buffer circuit, which can be particularly simply implemented by two cross-coupled NAND elements, guarantees that an input signal A, represented here by way of example by a change in a signal from low to high and which is initially transmitted directly to the output terminal, that is to say essentially without delay, is at the same time buffered in the buffer circuit.

The high state buffered in the buffer circuit defines the pulse of the output signal, that is to say its minimum pulse length. Buffering in the buffer circuit is cancelled when the change in the input signal from low to high has been propagated through the inverter chain. The input signal is then again exclusively responsible for the definition of the output pulse.

For the functioning of the proposed pulse generator circuit, the only precondition is that the length of the input signal is longer than the time which is needed for the buffering operation, on the basis of gate delay times. As a result of the buffering, a minimum pulse length of the output pulse is guaranteed, and is independent of the length of the input signal.

The pulse generator according to the invention has inverting elements connected in series, a logic combining element and a delay element. The buffer circuit connected downstream of the delay element and the input terminal ensures that even in the case of an input signal with a very short duration an output pulse generated from the input signal is guaranteed to have a minimum pulse length.

The significant feature in the pulse generator is, then, the specific configuration of the combining element from a NOR element and leading the input signal via two different signal paths.

The invention therefore permits a pulse generator in which the maximum pulse length of an output pulse is defined in a simple way by the duration of the input signal, and the minimum pulse length of the output pulse is defined by the delay time of a delay element.

In accordance with an added feature of the invention, the buffer circuit has two cross-coupled NAND elements.

In accordance with another feature of the invention, the buffer circuit has two cross-coupled NOR elements.

In accordance with an additional feature of the invention, the input signal is represented by a change in potential from low to high, and the output signal is a positive pulse.

In accordance with a further feature of the invention, the buffer circuit has a third input, which serves as an enable input, to which an enable signal can be supplied.

In accordance with an another added feature of the invention, a further inverter having a first terminal connected to the input terminal and a second terminal connected to the delay element and to the buffer circuit, is provided.

In accordance with a concomitant feature of the invention, an additional inverter having a first terminal connected to the output terminal of the buffer circuit and a second terminal connected to the second input of the NOR gate, is provided.

Other features which are considered as characteristic for the invention are set forth in the appended claims.

Although the invention is illustrated and described herein as embodied in a pulse generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
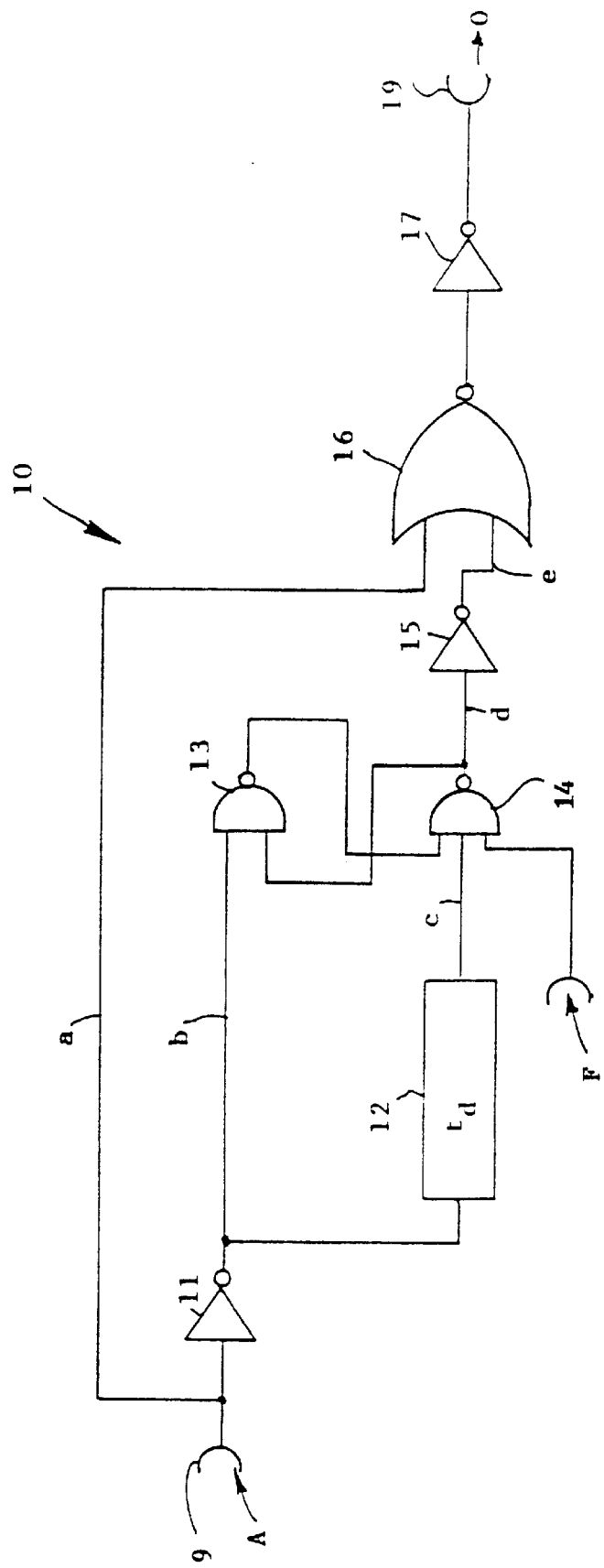
FIG. 1 is a circuit diagram of an exemplary embodiment of a pulse generator according to the invention.

In all the figures of the drawing, sub-features and integral parts that correspond to one another bear the same reference symbol in each case. Referring now to the figures of the drawing in detail and first, particularly, to FIG. 1 thereof, there is shown a pulse generator circuit 10 which contains a positive sequential logic circuit that generates an output pulse O as a reaction to an input signal A which is represented by a positive change in potential from low to high. Instead of this, as is familiar to those skilled in the art, an equivalent circuit can also be implemented which generates the output pulse O in response to a negative signal change in the input signal A. Likewise, the pulse generator circuit 10 according to the invention can be implemented with negative logic.

The exemplary embodiment of the pulse generator circuit 10 has a first signal path "a" between an input signal terminal 9 supplying the input signal A and a first input to a logic combining element 16 represented by a NOR element 16 and having two inputs. A second signal path b having a first inverting element 11, inverting the input signal A, between the input terminal 9 and a first input of a buffer circuit represented by two cross-coupled NAND elements 13, 14.

The input signal A inverted by the first inverting element 11 is also applied in parallel to one input of a delay element 12, whose output signal c is applied to a second input terminal of the buffer circuit having the two NAND elements 13, 14. A third input to the buffer circuit 13, 14 has applied to it an enable signal F supplied from the outside.

The output signal d from the buffer circuit 13, 14 is inverted by a second inverting element 15 and passes, as signal e, to the second input of the NOR element 16. The output from the latter is inverted by a third inverting element 17, whose output signal is supplied directly, as the output signal O, to an output terminal 19.

FIG. 1 shows that the input signal A, represented by a change in potential from low to high, is transmitted-immediately through the first input of the NOR element 16 to the output terminal 19, and therefore determines the (positive) leading edge of the output pulse O from the pulse generator circuit 10. At the same time, via the signal path b, the input signal A inverted by the first inverting element 11 is applied to the first input of the first NAND element 13 of the buffer circuit. Since the potential at the first input of the first NAND element 13 of the buffer circuit is low, the output from the NAND element 13 goes high. This high potential is applied to a first input of the second NAND element 14 of the buffer circuit and passes through there, so that the output from the second NAND element 14 goes low, provided that the two other inputs to the second NAND element 14 are likewise high.

The second input to the NAND element 14 remains high as long as the change in potential from high to low, representing the input signal A, has not yet appeared at the output of the delay element 12, and the third input to the NAND element 14 is high as long as the enable signal F is high and enables the pulse generator circuit 10. It is therefore possible, under these conditions, for the output of the NAND element 14 to go low (signal d) and, following the inversion by the second inverting element 15, to be applied as the signal e, in the form of a positive change in potential, to the second input to the NOR element 16.

Therefore, the low state "0" at the output of the NOR element 16, and therefore the high state of the output pulse O at the output terminal 19 will be maintained at least as long as the input signal e at the second input to the NOR element 16 remains high.

However, as the preceding description makes clear, the signal e remains high until the change in potential representing the input signal A has run through the delay element 12, that is to say when the signal c applied to the second input to the second NAND element 14 goes low. The signal d then goes high, the signal e goes low, the output from the NOR element 16 goes high and the output signal O goes low, provided that the input signal A, which is applied to the first input to the NOR element 16 through the first signal path a, does not still remain high.

The maximum pulse length of the output pulse O is thus defined by the duration of the input signal A, and the minimum pulse length of the output signal is defined by a delay time $t_d$ of the delay element 12.

Figure 2:
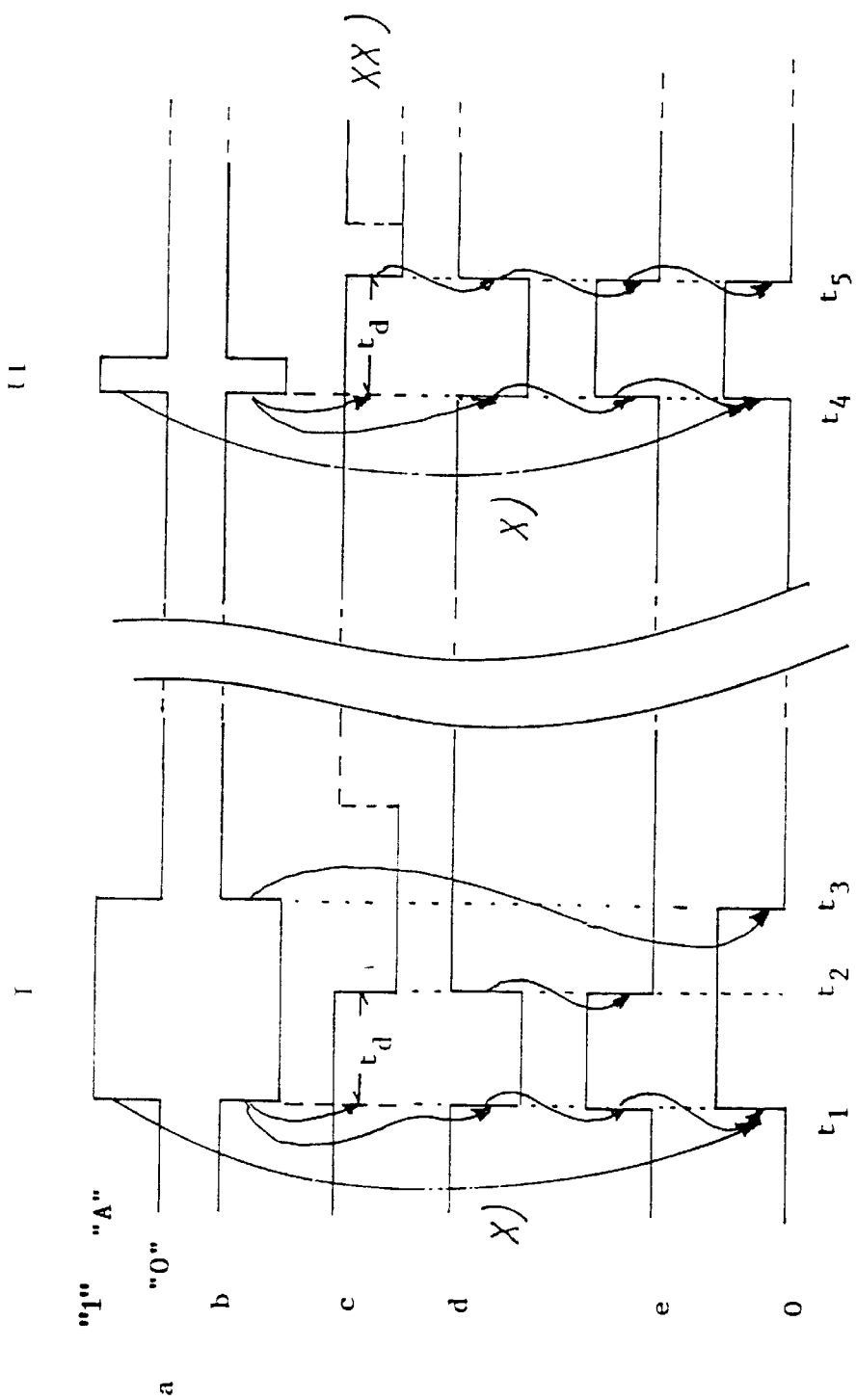
FIG. 2 is a timing/pulse diagram for explaining an operation of the pulse generator circuit.

FIG. 2 shows, in the form of a pulse diagram, the functioning explained above in words of the exemplary embodiment, shown in FIG. 1, of the pulse generator circuit 10 according to the invention, to be specific for the input signal A of a relatively long duration in the left-hand portion I, and for the input signal A of a shorter duration in the right-hand portion II.

The first line in FIG. 2 shows an exemplary signal shape for the input signal A at the input terminal 9 and on the signal path a. At a time $t_1$, the leading edge of the input signal A arrives at the input terminal 9, that is to say the input signal A experiences a change in potential from low to high, which remains high until time $t_3$.

The second line shows the signal waveform of the input signal inverted by the first inverting element 11 on the second signal path b, the inverted signal also being applied to the input of the delay element 12. The third line shows the signal c delayed by the delay time $t_d$ at the output from the delay element 12 (time $t_2$). The fourth line shows the signal d appearing at the output from the buffer circuit 13, 14. The fifth line shows the signal e inverted by the second inverting element 15. The sixth line shows the output pulse O.

FIG. 2 shows, in the sixth line in the portion I, that in the case of a relatively long-lasting input signal A, the output pulse O has a pulse length that corresponds with the length of the input signal A. In this case "relatively long" refers to being longer than the delay time $t_d$ of the delay element 12. This is based on the fact that the signal d at the output from the buffer circuit 13, 14, which goes high after the expiry of the delay time $t_d$ of the delay element 12 (signal c) at the time $t_2$, and therefore the signal e, which goes low on the basis of the inversion by the second inverting element 15, cannot pass through the NOR element 16, since the potential on its first input still remains high because of the relatively long-lasting input signal A via the first signal path a. Thus, in the example in portion I, the trailing edge of the output pulse O is determined by the duration of the input signal A (time $t_3$).

In the example II shown in the right-hand half of FIG. 2, an input signal A again appears at the input terminal 9 at the time $t_4$, but its duration is very much shorter than the input signal in the left-hand portion I of FIG. 2, and is also shorter than the delay time $t_d$ of the delay element 12.

As has already been explained, the delay time caused by the delay element 12, that is to say the resetting of the buffer circuit 13, 14 (at the time $t_5$), is critical for the duration of the output pulse O in this case, so that the case cannot occur here in which too short an input signal A generates no output pulse O, or an undefined output pulse O, at the output terminal 19, as could occur in the conventional pulse generator circuit described at the beginning.

Figure 3:
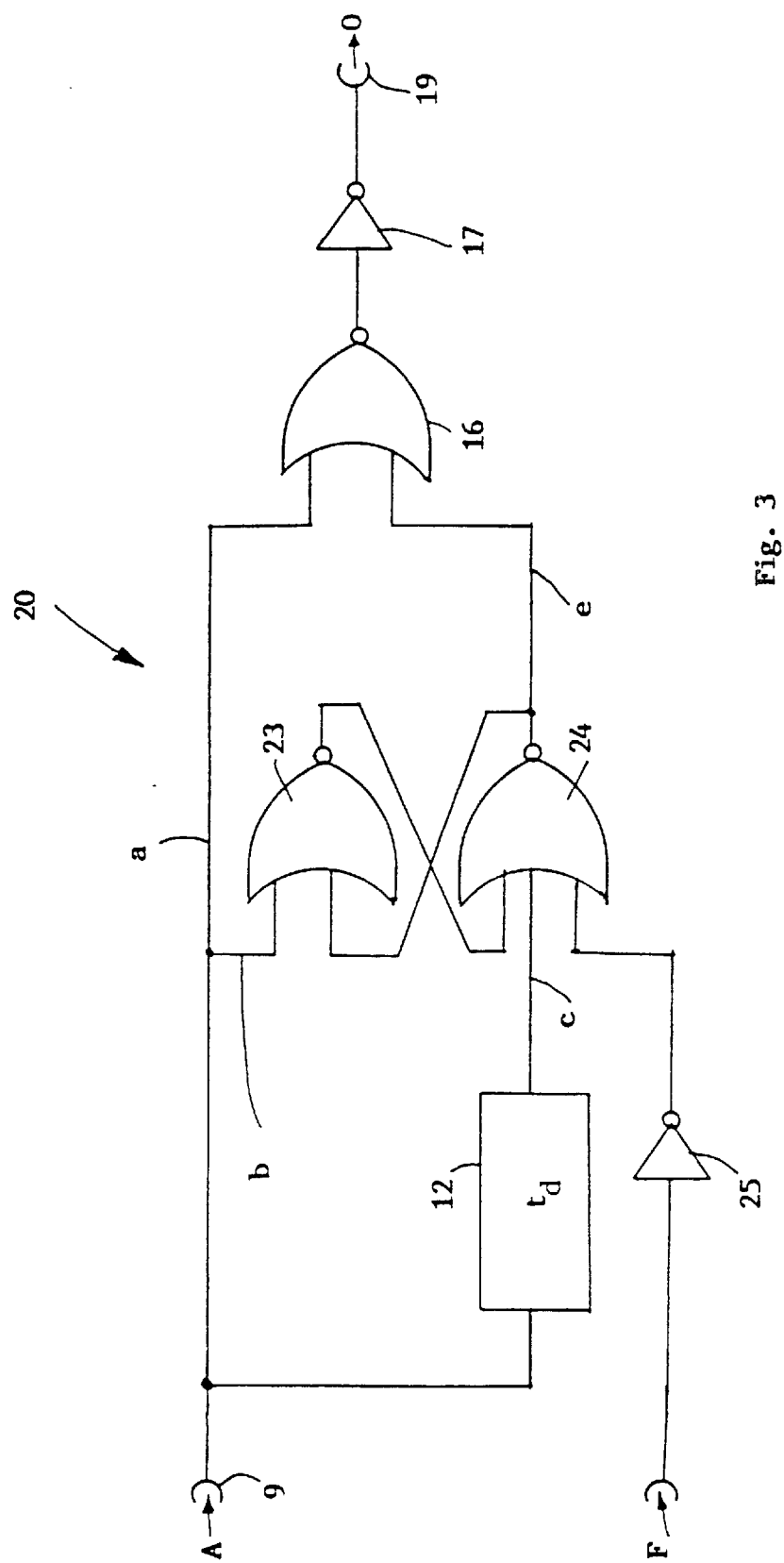
FIG. 3 is a circuit diagram of a further, improved exemplary embodiment of a pulse generator according to the invention.

FIG. 3 shows an exemplary embodiment of a pulse generator circuit 20 which has been optimized with regard to the number of components and the speed of the buffering operation, and in which the cross-coupled NAND elements forming the buffer circuit according to FIG. 1 have been replaced by cross-coupled NOR elements 23, 24. As FIG. 3 shows, the signal paths a and b coincide, so that the input signal A is not inverted before being buffered, and the propagation time of the inverting element 11 is saved. In functional terms, however, the circuit in FIG. 3 is identical to that in FIG. 1, so that a specific description for this purpose is superfluous, since its significant functions have already been explained with reference to FIGS. 1 and 2.

I claim:

1. A pulse generator, comprising:
   a NOR gate having a first input, a second input, and an output;
   an inverter having an input connected to said output of said NOR gate and an output;
   an output terminal connected to said output of said inverter;
   an input terminal for receiving an input signal and connected directly, via a: first signal path, to said first input of said NOR gate;
   a delay element having an input connected to said input terminal and an output, said delay circuit receiving the input signal and delays propagation of the input signal by a delay time; and
   a buffer circuit having a first input connected, via a second signal path, to said input terminal, a second input connected to said output of said delay element, and an output connected to said second input of said NOR gate, said buffer circuit receiving and being set by the input signal virtually without delay, said buffer circuit being reset after an expiry of the delay time defined by said delay element and leads to a generation of an output pulse with a defined minimum pulse length available at said output terminal if the input signal is less than the delay time, and if the input signal is longer than the delay time, a pulse length of the output pulse is defined by a pulse length of the input signal.

2. The pulse generator according to claim 1, wherein said buffer circuit has two cross-coupled NAND elements.

3. The pulse generator according to claim 1, wherein said buffer circuit has two cross-coupled NOR elements.

4. The pulse generator according to claim 1, wherein the input signal is represented by a change in potential from low to high, and the output signal is a positive pulse.

5. The pulse generator according to claim 1, wherein said buffer circuit has a third input, which serves as an enable input, to which an enable signal can be supplied.

6. The pulse generator according to claim 1, including a further inverter having a first terminal connected to said input terminal and a second terminal connected to said delay element and to said buffer circuit.

7. The pulse generator according to claim 6, including an additional inverter having a first terminal connected to said output terminal of said buffer circuit and a second terminal connected to said second input of said NOR gate.

8. The pulse generator according to claim 1, wherein said input terminal for receiving an input signal is connected directly with no other connection, through said first signal path, to said first input of said NOR gate.

9. A pulse generator, comprising:
   a NOR gate having a first input, a second input, and an output;
   an inverter having an input connected to said output of said NOR gate and an output;
   an output terminal connected to said output of said inverter;
   an input terminal for receiving an input signal and connected directly, via a first signal path, to said first input of said NOR gate;
   a delay element having an input connected to said input terminal and an output, said delay circuit receiving the input signal and delays propagation of the input signal by a delay time; and
   a buffer circuit having a first input connected, via a second signal path, to said input terminal, a second input connected to said output of said delay element, a third input serving as an enable input for an enable input signal, and an output connected to said second input of said NOR gate, said buffer circuit receiving and being set by the input signal virtually without delay, said buffer circuit being reset after an expiry of the delay time defined by said delay element and leads to a generation of an output pulse with a defined minimum pulse length available at said output terminal if the input signal is less than the delay time, and if the input signal is longer than the delay time, a pulse length of the output pulse is defined by a pulse length of the input signal.

10. The pulse generator according to claim 9, wherein said buffer circuit has two cross-coupled NAND elements.

11. The pulse generator according to claim 9, wherein said buffer circuit has two cross-coupled NOR elements.

12. The pulse generator according to claim 9, wherein the input signal is represented by a change in potential from low to high, and the output signal is a positive pulse.

13. The pulse generator according to claim 9, further comprising a further inverter having a first terminal connected to said input terminal and a second terminal connected to said delay element and to said buffer circuit.

14. The pulse generator according to claim 13, further comprising an additional inverter having a first terminal connected to said output terminal of said buffer circuit and a second terminal connected to said second input of said NOR gate.

\* \* \* \* \*